(12) United States Patent
Ma

(10) Patent No.: US 8,947,143 B2
(45) Date of Patent: Feb. 3, 2015

(54) DUTY CYCLE CORRECTOR

(71) Applicant: Nanya Technology Corporation, Tao-Yuan Hsien (TW)

(72) Inventor: Yan-Tao Ma, Boise, ID (US)

(73) Assignee: Nanya Technology Corporation, Tao-Yuan Hsien (TW)

( * ) Notice: Subject to any disclaimer, the term of this patent is extended or adjusted under 35 U.S.C. 154(b) by 49 days.

(21) Appl. No.: 13/832,029

(22) Filed: Mar. 15, 2013

(65) Prior Publication Data

US 2014/0266360 A1 Sep. 18, 2014

(51) Int. Cl.
*H03K 3/017* (2006.01)
*H03K 5/156* (2006.01)

(52) U.S. Cl.
CPC .................................. *H03K 5/1565* (2013.01)
USPC ............................ 327/175; 327/172; 327/299

(58) Field of Classification Search
USPC ........................................................ 327/175
See application file for complete search history.

(56) References Cited

U.S. PATENT DOCUMENTS 5,909,134 A * 6/1999 Sohn et al. ..................... 327/295
2002/0084817 A1* 7/2002 Nair et al. ..................... 327/175
2009/0201064 A1* 8/2009 Kim et al. ..................... 327/299

* cited by examiner

*Primary Examiner* — Lincoln Donovan
*Assistant Examiner* — Patrick Chen
(74) *Attorney, Agent, or Firm* — CKC & Partners Co., Ltd.

(57) ABSTRACT

The duty cycle corrector for correcting a system clock signal comprises a duty cycle detector and a duty cycle adjuster. The duty cycle detector is configured for detecting a system duty cycle of the system clock signal and generating the first control signal and the second control signal, wherein the first control signal and the second control signal are complementary to each other. The duty cycle adjuster comprises an inverter and the duty cycle adjuster is configured for delaying a change in an input status of the inverter and adjusting of the inverter in accordance with the first control signal and the second control signal.

8 Claims, 4 Drawing Sheets

DUTY CYCLE CORRECTOR

BACKGROUND

1. Field of Invention

The present invention relates to an integrated circuit. More particularly, the present invention relates to a duty cycle corrector with a single gate duty adjuster.

2. Description of Related Art

In recent years, the performance demands for consumer electronic products, such as mobile phones and tablets, are increasing, thus resulting in the need of increasing clock speed and accurate signal timings for a proper operation. For example, the speed of data access in these consumer electronic products has been a bottleneck in recent years. Although a dynamic random access memory (DRAM) has been developed to provide faster access time with a scaled down manufacturing process, the DRAM faces extreme challenges in reliability.

For example, a challenge of generating the accurate clock signals is to generate internal clock signals while the duty cycle of the external clock signals is maintained. The duty cycle of an internal clock signal becomes distorted when the ratio of high voltage level to low voltage level of an internal clock signal is different from the ratio of high voltage level to low voltage level of the external clock signals.

The manufacturing process distorts the duty cycle. In other words, the clock generation circuits are distorted by the variation of the manufacturing process. As a result, the duty cycle distortion may reduce the performance of DRAM. Further, in certain cases, the duty cycle distortion may cause a failure in DRAM.

Therefore, a heretofore unaddressed need exists for correcting the system clock signals to address the aforementioned deficiencies and inadequacies.

SUMMARY

One aspect of the present invention is to provide a duty cycle corrector to correct a system clock signal. The duty corrector comprises a duty cycle detector and a duty cycle adjuster. The duty cycle detector is configured for detecting a system duty cycle of the system clock signal and accordingly generating a first control signal and a second control signal, wherein the first control signal and the second control signal being complementary to each other. The duty cycle adjuster comprises an inverter and the duty cycle adjuster is configured for delaying a change in an input status of the inverter and adjusting an output driving ability of the inverter in accordance with the first control signal and the second control signal to correct a system clock signal.

In the foregoing, the inverter is configured for receiving a reference clock signal and generating the system clock signal and the duty cycle adjuster further comprises an inverter, a partial edge-latching unit and a driving unit. The inverter is configured for receiving a reference clock signal and generating the system clock signal. The partial edge-latching unit is configured for delaying the change in the input status of the inverter in accordance with the first control signal. The driving unit is configured for adjusting the output driving ability of the inverter in accordance with the second control signal.

According to one embodiment of the present invention, the partial edge-latching unit pulls down an input level of the inverter when the first control signal is at a high voltage level.

According to another embodiment of the present invention, the partial edge-latching unit boosts an input level of the inverter when the first control signal is at a low voltage level.

According to yet another embodiment of the present invention, the driving unit provides an extra current to charge an output level of the inverter when the second control signal is at a low voltage level.

According to still another embodiment of the present invention, the driving unit provides an extra current path to discharge an output level of the inverter when the second control signal is at a high voltage level.

According to yet another embodiment of present invention, the first control signal and the second control signal are analog signals or digital signals.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
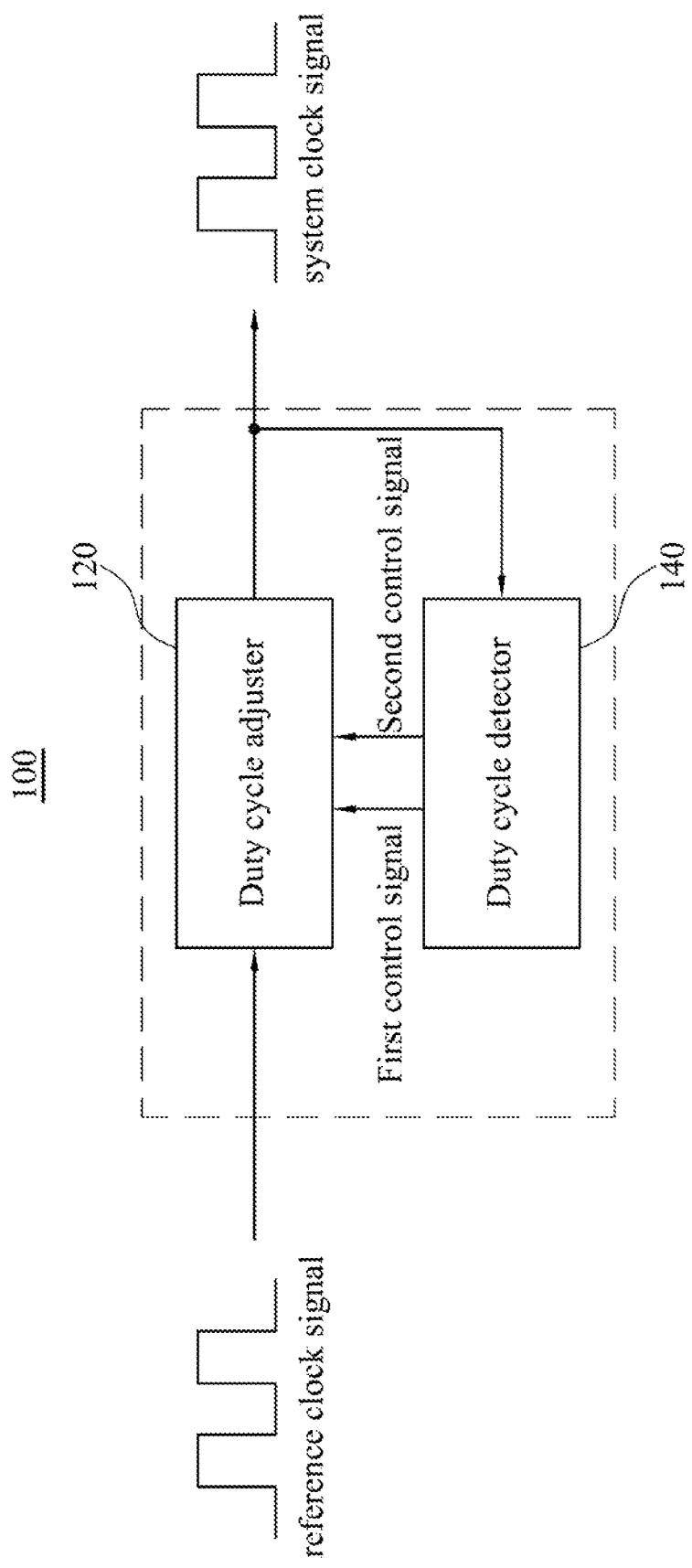
FIG. 1 schematically shows a duty cycle corrector according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, a duty cycle corrector is schematically shown according to one embodiment of the present invention. The duty cycle corrector 100 is configured for generating a system clock signal in accordance with a reference dock signal. The duty cycle corrector 100 comprises a duty cycle adjuster 120 and a duty cycle detector 140. The duty cycle adjuster 120 is configured for delaying a change in an input status in accordance with a first control signal and adjusting an output driving ability in accordance with a second control signal. In addition, the first control signal and the second control signal are complementary to each other. The duty cycle adjuster 120 achieves a wide range duty cycle adjustment with a skill referred to as partial edge-latching modulation (PELM) and another skill referred to as complementary driving strength ratio corroboration (CDSRC). These skills will be described in detail later in the specification.

The duty cycle detector 140 is configured for detecting a system duty cycle of the system clock signal and generating the first control signal and the second control signal in accordance with the system clock cycle. For example, when the system clock cycle is smaller than a reference clock cycle of the reference clock signal, the duty cycle detector 140 generates the first control signal with a high voltage level and the second control signal with a low voltage level. In contrast, when the system clock cycle is greater than the reference clock cycle of the reference clock signal, the duty cycle detector 140 generates the first control signal with the low voltage level and the second control signal with the high voltage level.

Figure 2:
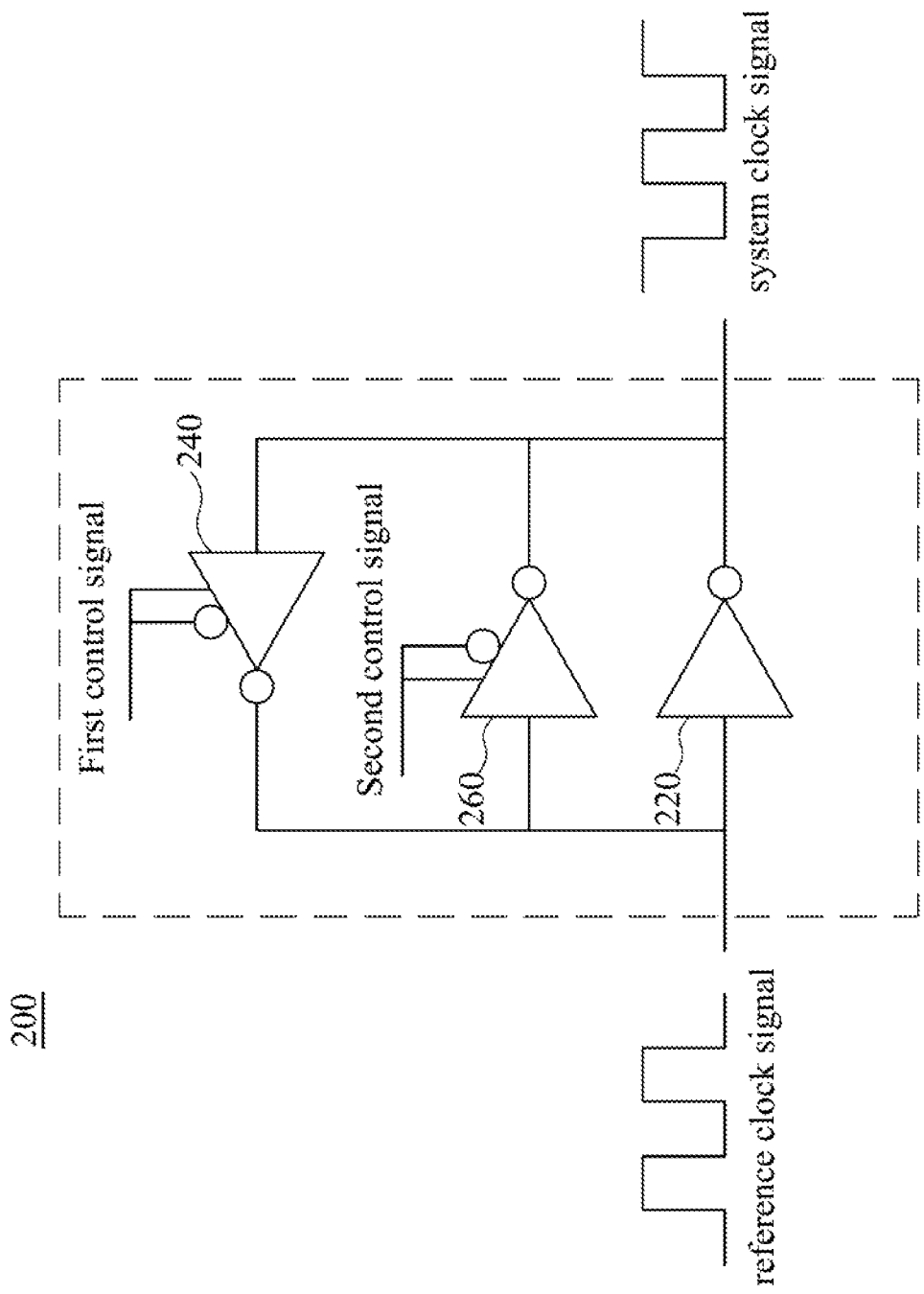
FIG. 2 schematically shows a duty cycle adjuster according to another embodiment of this invention.

Referring to FIG. 2, the duty cycle adjuster is schematically shown according to another embodiment of the present invention. The duty cycle adjuster 200 comprises an inverter 220, a partial edge-latching unit 240 and a driving unit 260. The inverter 220 is configured for receiving the reference clock signal and generating the corresponding system clock signal. The partial edge-latching unit 240 is electrically connected to the inverter 220 in parallel for delaying the change in the input status of the inverter 220 in accordance with the first control signal. The operation of the partial edge-latching unit 240 is corresponding to the aforementioned PELM. The driving unit 260 is electrically connected to the inverter 220 in parallel for adjusting the output driving ability of the inverter 220 in accordance with the second control signal. The operation of the driving unit 260 is corresponding to the aforementioned CDSRC.

Figure 3:
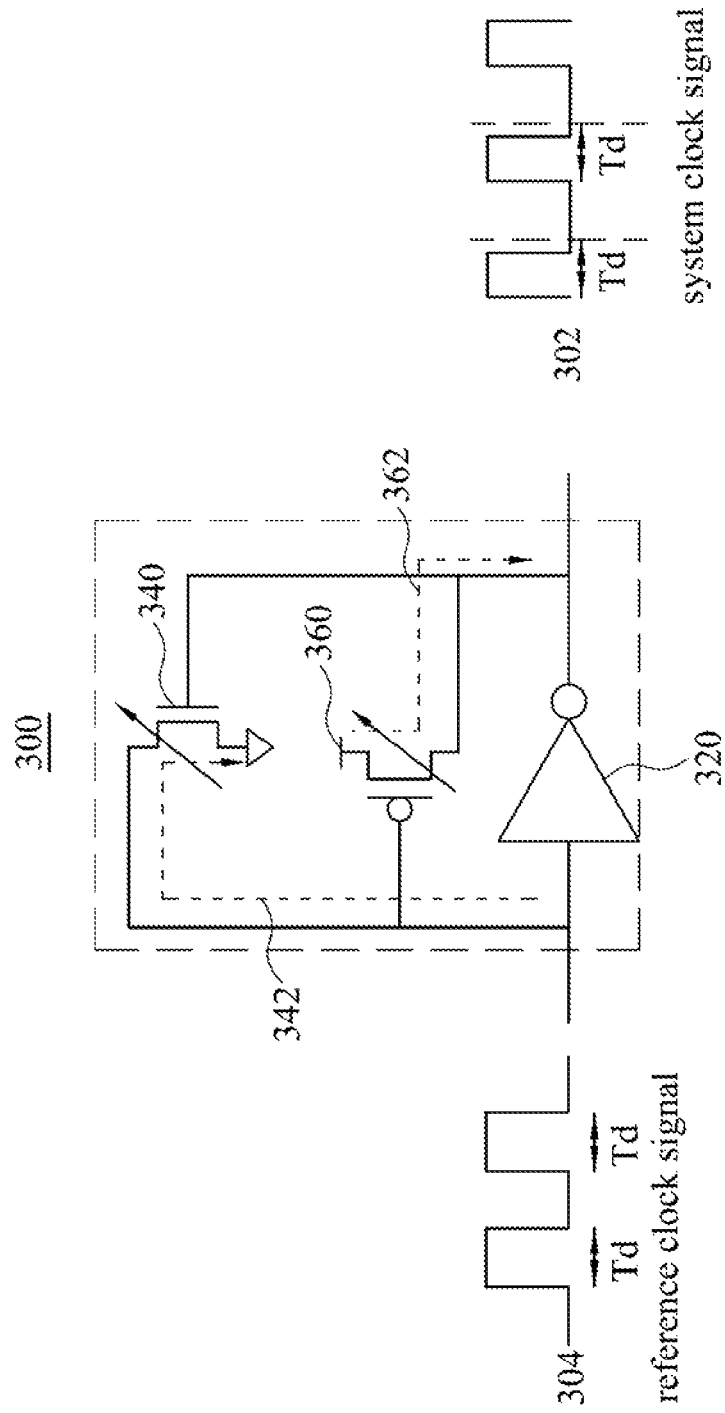
FIG. 3 schematically shows an operation of a duty cycle adjuster according to yet another embodiment of this invention.

Referring to FIG. 3, the duty cycle adjuster is schematically shown according to yet another embodiment of the present invention. In this embodiment, it is assumed that the current system clock signal 302 is distorted by the manufacturing process which leads the current system clock cycle to smaller than the reference clock cycle ($t_d$) of the reference clock signal 304. According to the current system clock cycle, the duty cycle detector generates the first control signal with a high voltage level. Then, the partial edge-latching unit is configured for pulling down an input level of the inverter 320 to correct the current system duty cycle.

For example, when the first control signal is at the high voltage level, the partial edge-latching unit is a first N-type metal-oxide-semiconductor field-effect transistor (MOSFET) 340. The drain of the first N-type MOSFET 340 is electrically connected to the input of the inverter 320, the gate of the first N-type MOSFET 340 is electrically connected to the output of the inverter 320, and the source of the first N-type MOSFET 340 is electrically connected to the ground. As soon as the output level of the inverter 320 reaches the high voltage level (i.e. logic "1"), the first N-type MOSFET 340 is turned on to latch the status of low voltage input level (i.e. logic "0") of the inverter 320, which forms a negative feedback 342 to the inverter 320. Whenever the input level of inverter 320 is changed from logic "0" to logic "1" on its rising edge, this negative feedback 342 has to be overcome before the output level of the inverter 320 flips from logic "1" to the logic "0". The aforementioned operation is the so-called PELM on the rising edge on the input level of the inverter 320, which increases the system clock cycle.

Furthermore, in the aforementioned embodiment, the first control signal and the second control signal are complementary to each other, meaning that the duty cycle detector generates the second control signal with a low voltage level in accordance with the current system cycle in FIG. 3. Then, the driving unit is configured for providing an extra current to charge the output of the inverter 320 to correct the current system duty cycle.

For example, when the second control signal is at the low voltage level, the driving unit is a first P-type MOSFET 360. The drain of the first P-type MOSFET 360 is electrically connected to the output of the inverter 320, the gate of the first P-type MOSFET 360 is electrically connected to the input of the inverter 320, and the source of the first P-type MOSFET 360 is electrically connected to a supply voltage. As soon as the input level of the inverter 320 goes logic "0", the first P-type MOSFET 360 is turned on to provide the extra current 362 to charge the output level of the inverter 320 for assisting the output of the inverter 320 to flip faster. The aforementioned operation is the so-called CDRSC on the rising edge on the output of the inverter 320, which also increases the system clock cycle.

Figure 4:
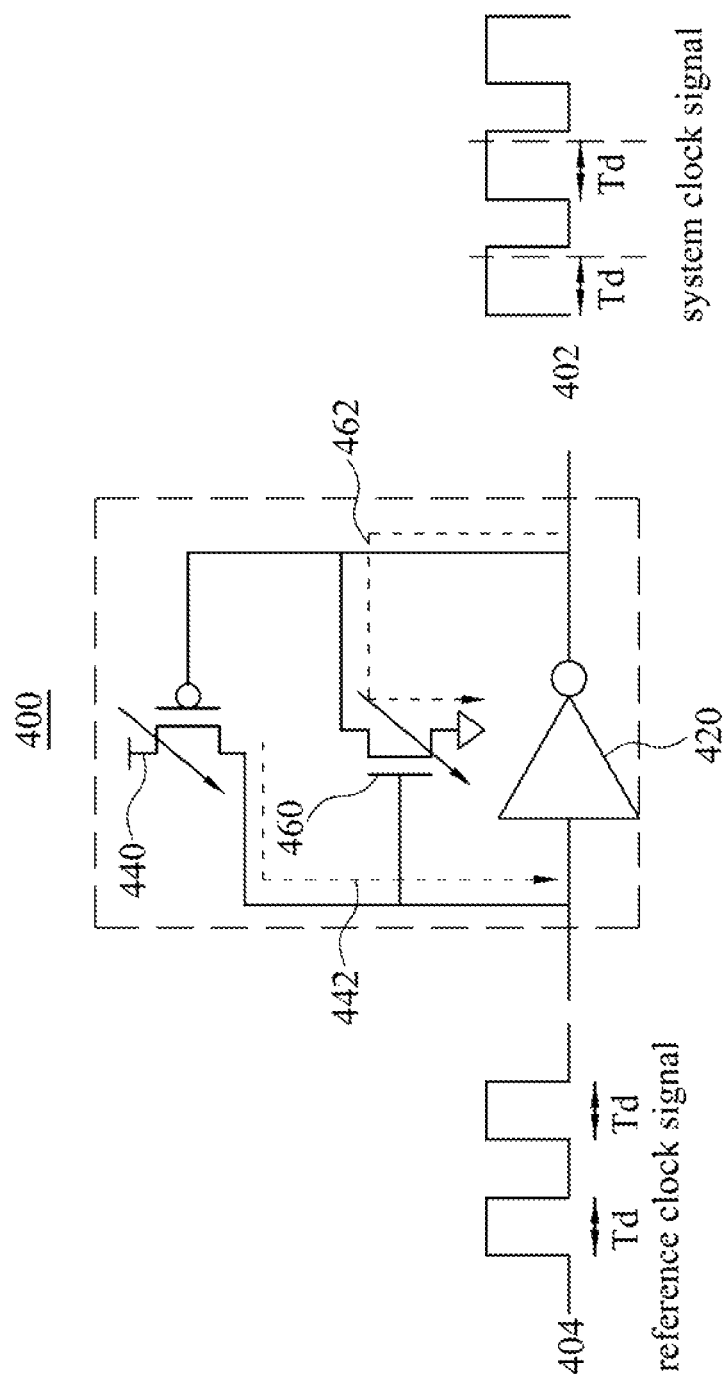
FIG. 4 schematically shows an operation of a duty cycle adjuster according to still another embodiment of this invention.

Referring to FIG. 4, the duty cycle adjuster is schematically shown according to another embodiment of the present invention. In this embodiment, the current system clock signal 402 is distorted by the manufacturing process which leads the current system clock cycle to greater than the reference clock cycle ($t_d$) of the reference clock signal 404. According to the current system clock cycle, the duty cycle detector generates the first control signal with a low voltage level. Then, the partial edge-latching unit is configured for boosting an input level of the inverter 420 to correct the current system duty cycle.

For example, when the first control signal is at the low voltage level, the partial edge-latching unit is a second P-type MOSFET 440. The drain of the second P-type MOSFET 440 is electrically connected to the input of the inverter 420, the gate of the second P-type MOSFET 440 is electrically connected to the output of the inverter 420, and the source of the second P-type MOSFET 440 is electrically connected to the supply voltage. As soon as the output level of the inverter 420 goes to logic "0", the second P-type MOSFET 440 is turned on to latch the status of input level, logic "1", of the inverter 420, which forms the negative feedback 442 to the inverter 420. Whenever the input level of inverter 420 is changed from logic "1" to logic "0" on its falling edge, this negative feedback 442 has to be overcome before the output level of the inverter 420 flips from logic "0" to logic "1". The aforementioned operation is the so-called PELM on the falling edge on the input level of the inverter 420, which reduces the system clock cycle.

Moreover, in the aforementioned embodiment, the duty cycle detector generates the second control signal with the high voltage level in accordance with the current system cycle in FIG. 4. Then, the driving unit is configured for providing an extra current path to discharge an output level of the inverter to correct the current system duty cycle.

For example, when the second control signal is at the high voltage level, the driving unit is a second N-type MOSFET 460. The drain of the second N-type MOSFET 460 is electrically connected to the output of the inverter 420, the gate of the second N-type MOSFET 460 is electrically connected to the input of the inverter 420, and the source of the second N-type MOSFET 460 is electrically connected to the ground. As soon as the input level of the inverter 420 goes logic "1", the second N-type MOSFET 460 is turned on to provide the extra current path 462 to discharge the output level of the inverter 420, for assisting the output level of the inverter 420 to flip faster. The aforesaid operation is the so-called CDRSC on the falling edge on the output level of the inverter 420, which also reduces the system clock cycle.

An all-digital or mixed signal design with digital control is a practical choice to the duty cycle detector for generating the first control signal and the second control signal. For example, in the all-digital design, the first control signal and the second control signal are digital signals, such as a bus of digital signal. Alternatively, in the mixed signal design, the first control signal and the second control signal are analog signals, which can be generated by a digital-to-analog converter (DAC). For example, assuming that the first control signals is analog signal, if the voltage level of first control signal is greater than the threshold voltage of the N-type MOSFET, the duty cycle adjuster is mostly operated as shown in FIG. 3. In contrast, if the voltage level of second control signal is greater than the threshold voltage of the P-type MOSFET, the duty cycle adjuster is mostly operated as shown in FIG. 4. Further, if the voltage level of the first control signal is greater than the threshold voltage of the N-type MOSFET, and the voltage level of second control signal is greater than the threshold voltage of the P-type MOSFET, the duty cycle adjuster is both operated as shown in FIG. 3 and FIG. 4.

The above description shows a duty cycle corrector with a duty cycle adjuster with one gate delay. The duty cycle adjuster with PELM and CDSRC leads to the advantages of low cost, a minimum forward path delay and a wide correction range.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A duty cycle corrector, suitable for correcting a system clock signal, comprising:
    a duty cycle detector for detecting a system duty cycle of the system clock signal and accordingly generating a first control signal and a second control signal, the first control signal and the second control signal being complementary to each other; and
    a duty cycle adjuster, comprising
        an inverter configured for generating the system clock signal:
        and
        a partial edge-latching unit configured for delaying a change in an input status of the inverter in accordance with the first control signal by providing a negative feedback between an input terminal and an output terminal of the inverter.

2. The duty cycle corrector of claim 1, wherein the inverter is configured for receiving a reference clock signal and generating the system clock signal, and the duty cycle adjuster further comprises:
    a driving unit for adjusting the output driving ability of the inverter in accordance with the second control signal.

3. The duty cycle corrector of claim 2, wherein the partial edge-latching unit pulls down an input level of the inverter when the first control signal is at a high voltage level.

4. The duty cycle corrector of claim 2, wherein the partial edge-latching unit boosts an input level of the inverter when the first control signal is at a low voltage level.

5. The duty cycle corrector of claim 2, wherein the driving unit provides a current to charge an output level of the inverter when the second control signal is at a low voltage level.

6. The duty cycle corrector of claim 2, wherein the driving unit provides a current path to discharge an output level of the inverter when the second control signal is at a high voltage level.

7. The duty cycle corrector of claim 1, wherein the first control signal and the second control signal are analog signals.

8. The duty cycle corrector of claim 1, wherein the first control signal and the second control signal are digital signals.

* * * * *